United States Patent
Ditterich et al.

(10) Patent No.: US 11,909,304 B2
(45) Date of Patent: Feb. 20, 2024

(54) METHOD FOR CONTROLLING SEMICONDUCTORS

(71) Applicant: Meritor Electric Vehicles Germany GmbH, Nuremberg (DE)

(72) Inventors: Jürgen Ditterich, Nuremberg (DE); Herbert Eder, Winkelhaid (DE)

(73) Assignee: Meritor Electric Vehicles Germany GmbH, Nuremberg (DE)

( * ) Notice: Subject to any disclaimer, the term of this patent is extended or adjusted under 35 U.S.C. 154(b) by 361 days.

(21) Appl. No.: 17/415,495

(22) PCT Filed: Dec. 12, 2019

(86) PCT No.: PCT/EP2019/084826
§ 371 (c)(1),
(2) Date: Jun. 17, 2021

(87) PCT Pub. No.: WO2020/126796
PCT Pub. Date: Jun. 25, 2020

(65) Prior Publication Data
US 2022/0052598 A1    Feb. 17, 2022

(30) Foreign Application Priority Data

Dec. 18, 2018 (EP) ..................... 18213350

(51) Int. Cl.
*H02M 1/088* (2006.01)
*B60R 16/03* (2006.01)
(Continued)

(52) U.S. Cl.
CPC ............ *H02M 1/088* (2013.01); *B60R 16/03* (2013.01); *H02M 1/092* (2013.01); *H02M 5/4585* (2013.01)

(58) Field of Classification Search
CPC .... H02M 1/092; H02M 1/088; H02M 5/4585; B60R 16/03
See application file for complete search history.

(56) References Cited

U.S. PATENT DOCUMENTS

2015/0003822 A1  1/2015 Fukada et al.
2015/0300320 A1  10/2015 Diedrichs
(Continued)

FOREIGN PATENT DOCUMENTS

CN    103683870 A  *  3/2014
CN    104158853 A  *  11/2014
(Continued)

OTHER PUBLICATIONS

Jenni, Felix et al.: "Steuerverfahren für selbstgeführte Stromrichter, Kapitel 9: Vorausberechnete Puismuster"; 1. Jun. 1995; pp.: 168-203; XP055744088; DOI: 10.3929/ethza-001427314; ISBN: 978-3-519-06176-2; Gefunden am Oct. 27, 2020 im Internet: URL:https://www.researchcollection.ethz.ch/handle/20.500.11860/142004.
(Continued)

*Primary Examiner* — Harry R Behm
(74) *Attorney, Agent, or Firm* — Brooks Kushman PC (57) ABSTRACT

In a method for controlling a plurality of semiconductors that form a power converter, a protocol for controlling the plurality of semiconductors is transmitted via a signal line between a control unit and the semiconductors. Additionally transmitted via the signal line is a sign-of-life signal, wherein the semiconductors are switched off, when the sign-of-life signal is absent, and the semiconductors of the power converter are switched using optimized pulse patterns.

13 Claims, 5 Drawing Sheets

(51) Int. Cl.
*H02M 5/458* (2006.01)
*H02M 1/092* (2006.01)

(56) References Cited

U.S. PATENT DOCUMENTS

| | | |
|---|---|---|
| 2016/0089988 A1 | 3/2016 | Bartz et al. |
| 2016/0152129 A1* | 6/2016 | West .................. B60L 5/36 |
| | | 180/65.21 |
| 2016/0352187 A1 | 12/2016 | Wolf |
| 2017/0366336 A1 | 12/2017 | Ditterich et al. |
| 2018/0131291 A1* | 5/2018 | Lavieville ............. H02M 7/483 |
| 2018/0239884 A1 | 8/2018 | Granig et al. |

FOREIGN PATENT DOCUMENTS

| | | | |
|---|---|---|---|
| DE | 10026263 B4 * | 4/2004 | ............ G08C 17/02 |
| DE | 10 2014 219 504 A1 | 3/2016 | |
| DE | 10 2017 103 418 A1 | 8/2018 | |
| EP | 3 029 829 A1 | 6/2016 | |
| GB | 24 83 317 A | 3/2012 | |
| RU | 2605446 C1 | 12/2016 | |
| RU | 2641707 C1 | 1/2018 | |

OTHER PUBLICATIONS

PCT International Search Report and Written Opinion of International Searching Authority dated Apr. 11, 2020 corresponding to PCT International Application No. PCT/EP2019/084826 filed Dec. 12, 2019.

* cited by examiner

METHOD FOR CONTROLLING SEMICONDUCTORS

CROSS-REFERENCES TO RELATED APPLICATIONS

This application is the U.S. National Stage of International Application No. PCT/EP2019/084826, filed Dec. 12, 2019, which designated the United States and has been published as International Publication No. WO 2020/126796 A1 and which claims the priority of European Patent Application, Serial No. 18213350.4, filed Dec. 18, 2018, pursuant to 35 U.S.C. 119(a)-(d).

BACKGROUND OF THE INVENTION

The invention relates to a method for controlling a plurality of semiconductors by means of a control unit, wherein a signal line is arranged between the control unit and the semiconductors, wherein a protocol for controlling the semiconductors is transmitted by way of the signal line. Furthermore, the invention relates to a semiconductor circuit with a plurality of semiconductors with a driver circuit and a control unit in each case, wherein a signal line is arranged between the control unit and the semiconductors, wherein a protocol for controlling the semiconductors can be transmitted by way of the signal line. The invention further relates to a power converter with a semiconductor circuit of this type. Furthermore, the invention relates to a vehicle with a power converter of this type and to a wind turbine with a power converter of this type.

In order to optimize the amount of wiring within a semiconductor circuit or a power converter, a change is made between the control unit and the semiconductors from a parallel control method to a serial control method. While the parallel control method for each semiconductor to be controlled requires an individual control line in each case, with the serial control method this information is bundled onto just one line and transmitted by means of a protocol, also referred to as a telegram. Here the semiconductors have in each case a driver circuit, which evaluates the signal relating thereto, particularly with respect to the control, i.e. switching on or off, and implements the same on the semiconductor.

In order to control the semiconductors of a power converter, optimized pulse patterns can be used, for instance. With these optimized pulse patterns, the switching time instants for the semiconductors are calculated in advance using optimization criteria for the next cycle of the basic oscillation of the initial alternating voltage of the power converter.

The object underlying the invention is to improve the transmission of signals from the control unit to the power converter with respect to transmission reliability.

SUMMARY OF THE INVENTION

This object is achieved by a method for controlling a plurality of semiconductors by means of a control unit in that a signal line is arranged between the control unit and the semiconductors, wherein a protocol for controlling the semiconductors is transmitted by way of the signal line, wherein a sign-of-life signal is additionally transmitted by way of the signal line, wherein the semiconductors are switched off if the sign-of-life signal is absent. This object is further achieved by a semiconductor circuit having a plurality of semiconductors with, in each case, a driver circuit and a control unit, so that a signal line is arranged between the control unit and the semiconductors, wherein a protocol for controlling the semiconductors can be transmitted by way of the signal line, wherein a sign-of-life signal can additionally be transmitted by way of the signal line, wherein if the sign-of-life signal is absent, the semiconductors can be switched off by means of the respective driver circuit. This object is further achieved by a power converter with a semiconductor circuit of this type, in that the semiconductors or at least one part of the semiconductors are arranged in a bridge circuit. Furthermore, this object is achieved by a vehicle having such a power converter and by a wind turbine having such a power converter.

Further advantageous embodiments of the invention are set out in the dependent claims.

The knowledge underlying the invention is that the transmission reliability can as a result improve if a failure or a malfunction of the signal transmission is reliably and rapidly identified. A malfunction is then typically identified if the protocol or the telegram is evaluated. Here the protocol can be configured to identify errors in the transmission. One example of such a telegram is a CRC coding, By using telegrams, delay times, which also act on possibly required protective shut-downs (detected and executed by the control unit), develop in order to form the switching information in the semiconductor circuit or in the power conductor. An adequate protective concept of the converter is no longer ensured as a result since protective switch-off times between one and two telegram lengths develop, The error identification time or the requirement to switch off the semiconductors by means of the control unit as a protective intervention therefore lies in the order of magnitude of 5 μs to 10 μs. In this time, currents can already develop in the semiconductor circuit or in the power converter, which result in the semiconductor or power converter being damaged or destroyed.

In order to solve this problem, a sign-of-life signal is therefore superimposed onto the serial telegrams in order to control the semiconductors on the same signal line by means of the control unit. This is permanently monitored for absence on the driver circuit of the semiconductor. If it is no longer available, the semiconductors are switched off by means of the driver circuit. This can be a protective intervention or an operationally deliberate, fast switching-off of the semiconductors.

This method and this arrangement are particularly advantageous for a power converter. Semiconductors which have a specific control task are arranged in a power converter. To this end, in most cases a number of semiconductors are arranged in a power converter and are controlled by means of the control unit. The amount of wiring can to some extent be significantly reduced by using the protocol. The sensitivity to electromagnetic interferences is reduced particularly when optical waveguides are used. These are particularly high in a power converter on account of the large currents and rapid switching operations. The reliability of the power converter can be significantly increased by using the protocol, in particular in combination with an optical waveguide, Furthermore, the method and this arrangement can be applied particularly advantageously to a modular design of the power converter. This is understood to mean a power converter which has a number of power converter modules arranged in a series circuit, or a redundant power converter which has a number of intermediate circuits, for instance. By controlling the individual power converter modules by means of optical waveguides, different electrical potentials, upon which the modules are disposed on account of the series circuit, can be mastered easily. At the same time, the design is insensitive to electromagnetic interferences. Furthermore, in addition both the functionality of the data transmission can be ensured and the intervention of protective functions can be realized by way of the sign-of-life signal.

These advantages result not only with modular power converters which have a series circuit of power converter modules, but instead also with redundant power converters, the power converter modules of which are often configured to be galvanically isolated, in order to prevent an error in one power converter module from affecting another power converter module. The drive of a vehicle, in particular of an electrically driven bus or rail vehicle, is used as an example here. A potential loss between the redundant subsystems can be reliably prevented with the afore-cited further advantages and a reliable operation can thus be ensured.

With an advantageous embodiment of the invention, the transmission of the sign-of-life signal is switched off by the control unit in order to initiate a protective intervention. A protective intervention to be initiated by the control unit then likewise acts directly on the sign-of-life signal. The sign-of-life signal is then no longer transmitted by way of the signal line. The driver circuit of the semiconductor identifies this, so that the semiconductors are switched off immediately. Rapid protective response times, which are comparable with those of the individual control, can therefore be realized. The portion of error response time by the communication between the control unit and the driver circuit is therefore reduced to the order of magnitude of 200 ns, with which a reliable protection of the semiconductor circuit or the power converter can be ensured.

In this way, it is possible to bundle signals for controlling the semiconductors onto one signal line and to simultaneously realize a rapid protection. The protective intervention which takes place here is initiated directly by the control unit, by switching off the sign-of-life signal or by means of an error in the transmission, for instance as a result of a cable break in the signal line.

In a further advantageous embodiment of the invention, the sign-of-life signal is transmitted cyclically or permanently. To ensure that the receiver, in other words the semiconductor, knows precisely when a sign-of-life signal is to be expected, in order, if it is absent, to effect a protective shut-down, it is advantageous if the sign-of-life signal is transmitted cyclically or permanently. The time instants at which a sign-of-life signal is expected by the driver circuit are therefore known and a protective shut-down can take place particularly quickly.

In a further advantageous embodiment of the invention, the sign-of-life signal is transmitted as a Manchester code. The Manchester code is a particularly simple coding, with which a sign-of-life signal can be generated on a signal line. Corresponding modules are available on the market at a low price so that the gain by reducing the hardware wiring is only insignificantly reduced by the modules for generating the Manchester code. A cost reduction when manufacturing the semiconductor circuit or the power converter can therefore be achieved. In an advantageous embodiment, the Manchester coding can also be integrated into the hardware of the control unit and the driver circuit or a converter.

In a further advantageous embodiment of the invention, the signal line is embodied as an optical waveguide or bus system. Both the optical waveguide and also the bus system represent simple solutions which are available on the market for bundling signals. These can be easily integrated into the semiconductor circuit or the power converter. Furthermore, the optical waveguide additionally still offers the advantage of potential separation. This is advantageous precisely for the semiconductor circuit or power converter with an intermediate circuit voltage of at least 1500 V. A potential loss is ruled out by using the optical waveguide. It is reliably prevented that the control unit is therefore subjected to impermissibly high voltages. Since the control module is often connected electrically with control elements, the application of impermissibly high voltages to the control element is therefore also prevented and an adequate protection against contact is ensured. This protection against contact is used to avoid causing injury to people.

In a further advantageous embodiment of the invention, the semiconductors form a power converter, wherein the switching of the semiconductors of the power converter takes place by means of optimized pulse patterns. With optimized pulse patterns, the switching time instants are calculated, i.e. predetermined, in advance within this basic oscillation period at the start of or before the start of a basic oscillation period of the initial voltage. The switching time instants are therefore already set for the future. These can be recorded in the protocol and transmitted. The transmission duration of the protocol therefore no longer plays a significant role. In other words, contrary to the cycle time determined by means of carrier methods, when optimized pulse patterns are used, there is no need to provide time for the transmission of the data by which the system lags behind the calculated values. In other words, the optimized pulse patterns allow for an immediate implementation of the drive behavior on the semiconductors despite significantly longer transmission times compared with the wire-based control. The use of the optimized pulse patterns combined with the protocol transmission allows for a synchronous control of the semiconductors. I.e. there is no time offset on account of the longer transmission duration on the semiconductors. This method is therefore particularly advantageous for the use of optimized pulse patterns, since for this case future switching information is already calculated in advance by the control unit and then already determined at a specific time before carrying out the switching operations and stored in the protocol.

BRIEF DESCRIPTION OF THE DRAWING

The invention is described and explained in more detail below on the basis of the exemplary embodiments shown in the figures, in which.

DETAILED DESCRIPTION OF PREFERRED EMBODIMENTS

Figure 1:
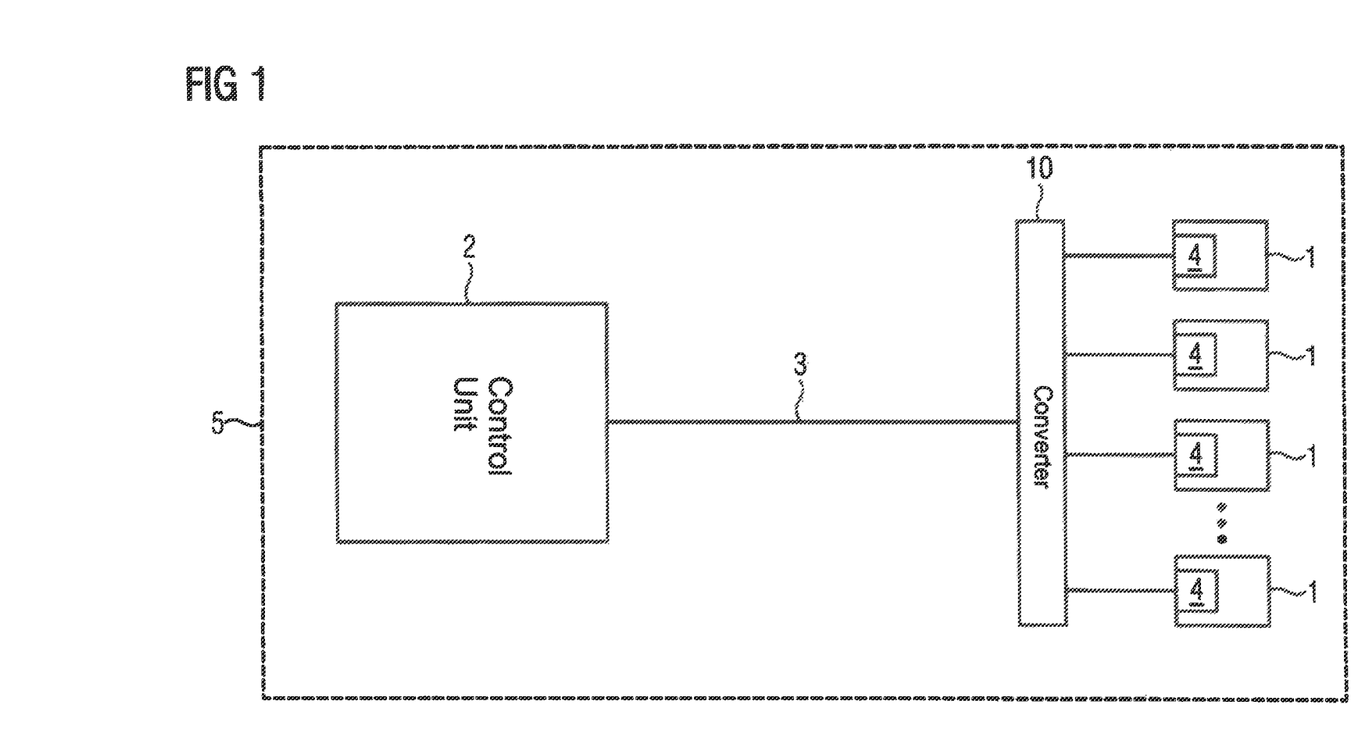
FIG. 1 shows the design of the semiconductor circuit.

FIG. 1 shows the design of a semiconductor circuit 5. This has a control unit 2 and a plurality of semiconductors 1. The control unit 2 is connected to the semiconductors 1 by way of a signal line 3. Control signals 13, i.e. switching information for the individual semiconductors 1, are transmitted to the semiconductors 1 by way of the signal line 3. These signals are received in a driver circuit 5 and converted into control pulses for the switching element of the semiconductor 1. In order to avoid a separate line for each semiconductor 1, the control signals 13 are transmitted bundled into a protocol 11 by way of just one signal line 3. The representation of the control signals 13 and the protocol 11 is carried out with the reference characters in the following figures. The signal line 3 can be an optical waveguide line or a copper line, for instance. With a copper line, a line pair is advantageously to be provided in each case, so that the reciprocating current can flow, or a defined voltage is applied between the two potentials of the line pair. A converter is present in order to separate the signals, i.e. the protocol 11, into the individual semiconductors 1, preferably in the spatial vicinity of the semiconductors 1. This can also convert an optical signal into an electrical signal, for instance. Similarly, but not necessarily, an evaluation of the protocol 11 can already take place at least partially in the converter 10.

Figure 2:
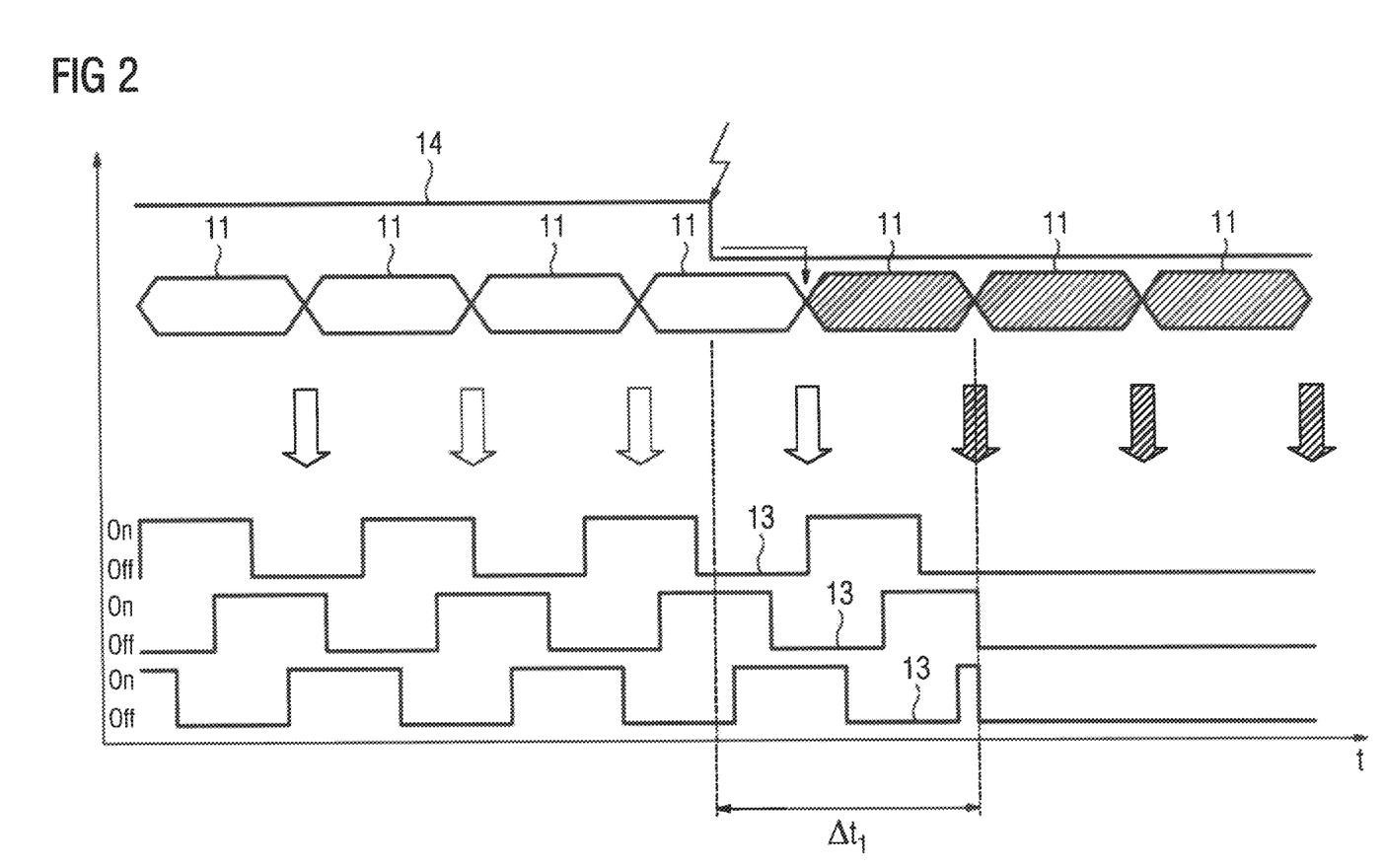
FIG. 2 shows the response over time when transmitting a protective intervention without a sign-of-life signal.

FIG. 2 shows the temporal course of the effect of the signal transmission from the control unit 2 to the semiconductors 1. Provided the operating signal 14 is present, in this example shown as a high level, the control unit 2 sends protocols 11 with the information relating to the switching operations by way of the signal line 3 to the driver circuit 4 of the semiconductors 1. The driver circuit 4 evaluates these and converts them into control signals 13 for the switching element of the respective semiconductor 1, in this case three semiconductors 1. If the semiconductors 1 are now all to be switched off at the point in time indicated with the flash, as a result for instance of an operational requirement or on account of a protective response, this information is therefore recorded in the protocol 11. These protocols 11 are shown as dark. It can however initially be completely recorded in the first protocol 11 that the requirement to switch off follows. It is only after evaluating the corresponding protocol by means of the driver circuit that this information is executed on the control signals 13 for the switching elements of the semiconductors 1. A duration $\Delta t_1$ from starting the switch-off until its execution therefore results for the switching-off of the semiconductors 1, in particular for a corresponding protective response. This lies in the order of magnitude of up to two protocol lengths and typically corresponds to a duration of 5 µs to 10 µs.

Figure 3:
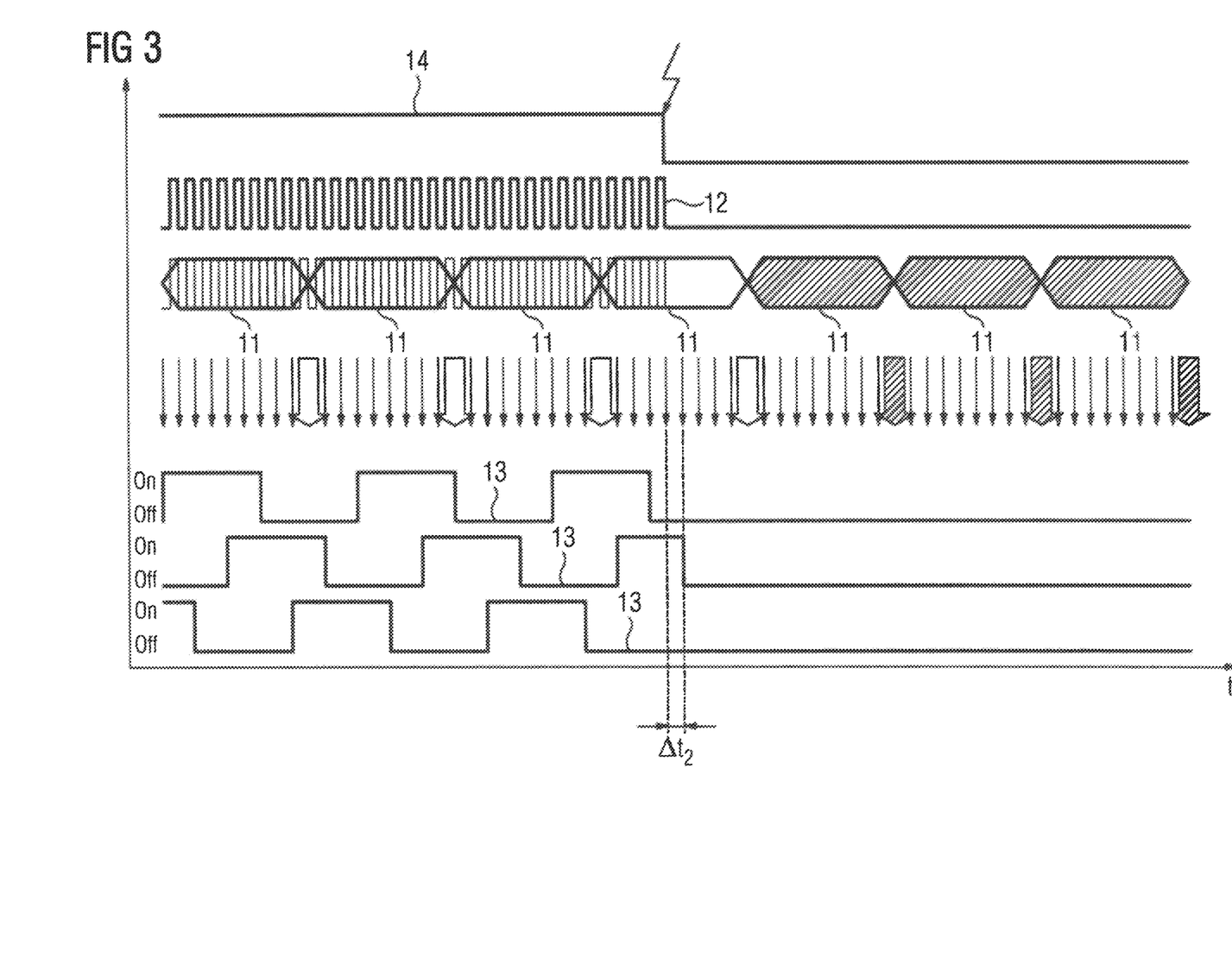
FIG. 3 shows the response over time when transmitting a protective intervention with a sign-of-life signal.

FIG. 3 shows a similar course, which results with the use of a sign-of-life signal 12. In order to avoid repetitions, reference is made to the description relating to FIG. 2 and to the reference characters cited there. Here, too, the operating signal 14 identifies the point in time relating to the requirement to switch off the semiconductors 1. At this point in time, the sign-of-life signal 12 is switched off. The sign-of-life signal is, as shown by the rectangular signal, part of the protocol 11. The protocols 11 are not only evaluated after a complete transmission, as shown by the thick arrows, but instead monitored continuously or in brief time intervals of less than 1 µs, particularly advantageously in the order of magnitude of 100 ns, for the presence of the sign-of-life signal 12. Once it is no longer present in the protocol, i.e. if the sign-of-life signal is absent, the semiconductors 1 are switched off directly. This results in a response time $\Delta t_2$, which lies in the order of magnitude of the time intervals while monitoring the sign-of-life signal. In order to ensure a particularly safe and reliable switch-off, it is also only possible to perform a switch-off when two or generally one previously defined number of switching edges are absent. Therefore errors in the signal transmission do not result in an unintentional switching-off of the semiconductors 1 of the semiconductor circuit 5. A response time $\Delta t_2$ of approx. 200 ns can be realized with this sign-of-life signal 12. The semiconductor circuit 5 or a power converter 20 can therefore be reliably protected against high currents, which may develop in the event of an error, by the semiconductors only being switched off with a minimal time delay.

From this time sequence, it is easy to identify that this method is particularly advantageous for the use of optimized pulse patterns, since for this case future switching information is already calculated in advance by the control unit 2 and is available in the control unit 2. This can then already be recorded in the protocol 11 by means of the control unit 2 at a point in time before executing the switching operation. After transmission, this information is then promptly provided in the driver circuit 4, in order to be able to be implemented on the semiconductors 1 of a power converter 20, 21, for instance.

Figure 4:
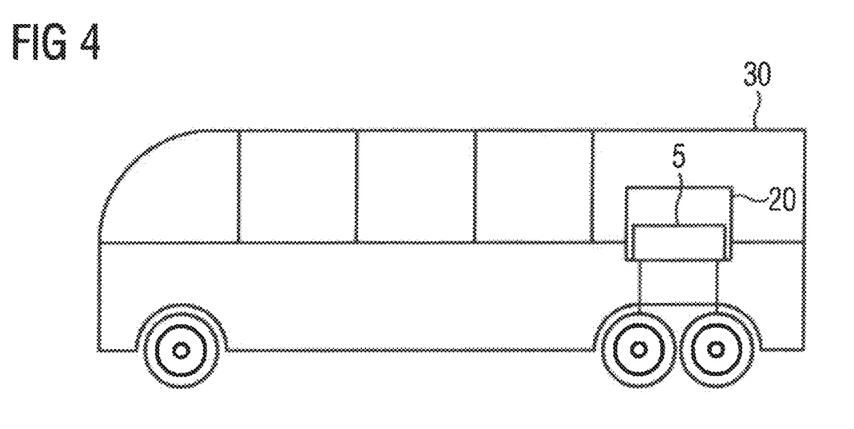
FIG. 4 shows a vehicle with a semiconductor circuit of this type.

FIG. 4 shows a vehicle 30, in this example a bus, but could also involve an automobile, truck or a rail vehicle, for instance. This vehicle 30 has a power converter 20 with a previously described semiconductor circuit 5. Here the power converter 20 supplies the motors of the vehicle 30 and can control or regulate the acceleration or slowing down of the vehicle 30. For safety reasons a vehicle 30 requires a switch-off of the semiconductors 1 to be carried out rapidly and above all reliably. Damage to the power converter 20 on account of excessively large currents in the case of an error must be avoided, so that a high reliability and availability of the vehicle 30 are reached and a breakdown of the vehicle 30 can be avoided.

Figure 5:
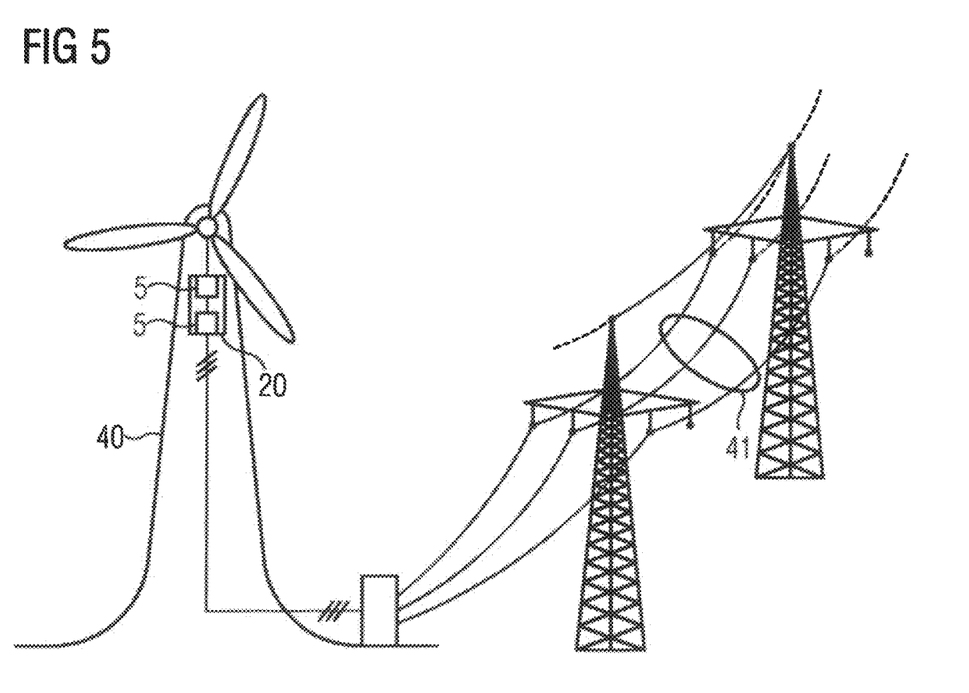
FIG. 5 shows a wind turbine with a semiconductor circuit of this type.

FIG. 5 shows a wind turbine 40 for obtaining electrical energy from wind. This energy is taken from the wind by way of rotor blades and converted by way of a power converter 20 with one or more semiconductor circuits 5 so that this can be fed into a power supply network 41. In order also here to ensure a reliable operation of the power converter 20, it has proven advantageous to equip this wind turbine 40 with a previously described semiconductor circuit 5. This ensures a rapid switching-off of the semiconductors 1, not shown in more detail here, and avoids damage or destruction of the semiconductors 1 as a result of excessively large currents particularly in the case of error.

Figure 6:
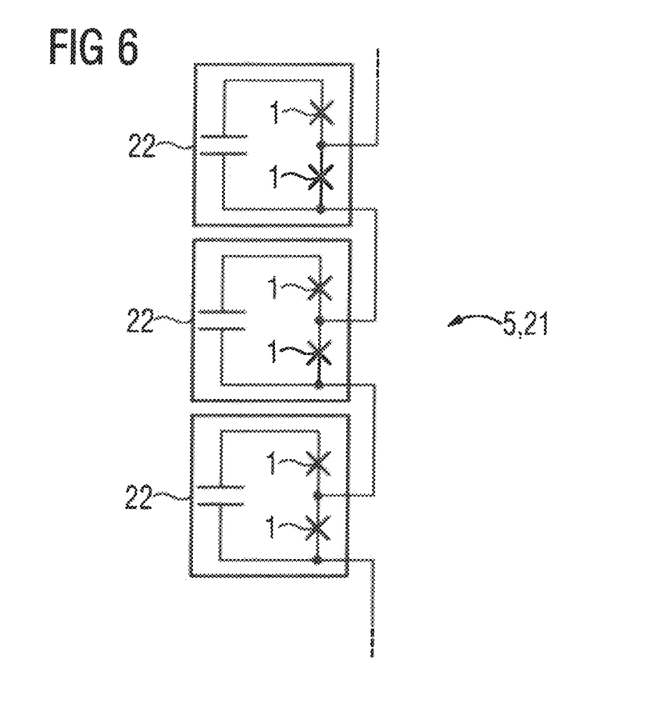
FIG. 6 shows a modular power converter with a series circuit of power converter modules.

FIG. 6 shows a cutout of a semiconductor circuit 5, with which the semiconductor circuit 5 forms a modular power converter 21. In order to improve clarity, the available semiconductors 1 are provided here only partially with the reference character. In the example shown the modular power converter 21 is an M2C power converter (modular multilevel converter). This has a plurality of power converter modules 22, which are arranged in a series circuit. The semiconductors 1 are therefore located on a different electrical potential. In order to bridge this potential difference, the use of optical waveguides is particularly advantageous, since these can also be reliably and confidently applied to controlling semiconductors 1, for instance of a power converter 20, 21, by means of the proposed method. At the same time, a rapid switching-off of the semiconductors 1 of the power converter is possible for a protective intervention by removing the operating signal and thus by omitting or switching-off of the sign-of-life signal 12.

Figure 7:
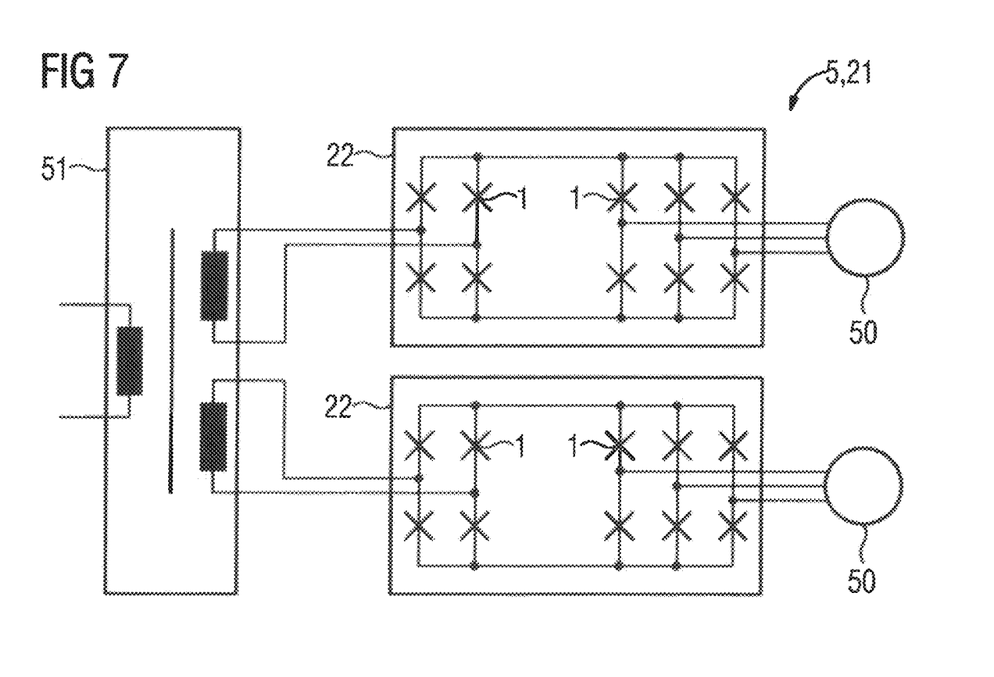
FIG. 7 shows a modular power converter with redundantly arranged power converter modules.

FIG. 7 shows a further exemplary embodiment of a modular power converter, in which the two power converter modules 22 are separated galvanically by way of the secondary winding of a transformer 51. Here, too, the available semiconductors 1 are only provided partially with their reference characters in order to increase the clarity of the representation. The motors 50, as examples of an electrical load, can be operated redundantly with this arrangement. In other words, failure of a power converter module 22 only results in failure of one of the motors 50. To ensure that an error in a power converter module 22 does not have an impact on the other power converter module 22, the control of the semiconductors 1 is to take place free of potential, such as is possible with optical waveguides, for instance. A loss of potential from one power converter module 22 to the other power converter module 22 can therefore be reliably ruled out. This achieves a higher availability and reliability of the power converter.

In summary, the invention relates to a method for controlling a plurality of semiconductors by means of a control unit, wherein a signal line is arranged between the control unit and the semiconductors, wherein a protocol for controlling the semiconductors is transmitted by way of the signal line. In order to improve the transmission of signals from the control unit to the power converter with respect to the transmission reliability, it is proposed that a sign-of-life signal is additionally transmitted by way of the signal line, wherein the semiconductors are switched off if the sign-of-life signal is absent. The invention further relates to a semiconductor circuit, having a plurality of semiconductors with in each case a driver circuit and a control unit, wherein a signal line is arranged between the control unit and the semiconductors, wherein a protocol for controlling the semiconductors can be transmitted by way of the signal line, wherein a sign-of-life signal can additionally be transmitted by way of the signal line, wherein in the absence of the sign-of-life signal the semiconductors can be switched off by means of the respective driver circuit. The invention further relates to a power converter with a semiconductor circuit of this type, wherein the semiconductor or at least one part of the semiconductors are arranged in a bridge circuit.

In other words, the invention relates to a semiconductor circuit, having a plurality of semiconductors with in each case a driver circuit and a control unit, wherein a signal line is arranged between the control unit and the semiconductors, wherein the signal line is designed to transmit a protocol for the control of the semiconductors, wherein the signal line is additionally designed to transmit a sign-of-life signal, wherein the driver circuit is designed so that the semiconductors are switched off by means of the respective driver circuit if the sign-of-life signal is absent. The invention further relates to a power converter, in particular a modular power converter, a vehicle and a wind turbine with a power converter of this type.

The invention claimed is:

1. A method, comprising:
    transmitting data in accordance with a protocol for controlling a plurality of semiconductors that form a power converter via a signal line between a control unit and the plurality of semiconductors;
    additionally transmitting a sign-of-life signal via the signal line;
    switching off the plurality of semiconductors, when the sign-of-life signal is absent;
    switching the plurality of semiconductors of the power converter using optimized pulse patterns; and
    switching off a transmission of the sign-of-life signal by the control unit for initiating a protective intervention.

2. The method of claim 1, wherein the sign-of-life signal is transmitted cyclically or permanently.

3. The method of claim 1, wherein the sign-of-life signal is transmitted as a Manchester code.

4. The method of claim 1, wherein the signal line is embodied as an optical waveguide and/or bus system.

5. A semiconductor circuit, comprising:
    a plurality of semiconductors configured to form a power converter;
    driver circuits operably connected to the plurality of semiconductors in one-to one correspondence;
    a control unit;
    a signal line arranged between the control unit and the plurality of semiconductors for transmitting data in accordance with a protocol for controlling the plurality of semiconductors and for additionally transmitting a sign-of-life signal,
    wherein the driver circuits are designed to switch off the plurality of semiconductors, when the sign-of-life signal is absent;
    wherein the plurality of semiconductors of the power converter are switched by optimized pulse patterns; and
    wherein the control unit is arranged to switch off transmission of the sign-of-life signal for initiating a protective intervention.

6. The semiconductor circuit of claim 5, wherein the signal line is embodied as an optical waveguide and/or bus system.

7. The semiconductor circuit of claim 5, wherein the sign-of-life signal is transmitted as a Manchester code.

8. A power converter, comprising a semiconductor circuit, said semiconductor circuit comprising a plurality of semiconductors, with the semiconductors or at least part of the semiconductors being arranged in a bridge circuit, driver circuits operably connected to the plurality of semiconductors in one-to one correspondence, a control unit, a signal line arranged between the control unit and the plurality of semiconductors for transmitting data in accordance with a protocol for controlling the plurality of semiconductors and for further transmitting a sign-of-life signal, wherein the driver circuits are designed to switch off the plurality of semiconductors, when the sign-of-life signal is absent, wherein the plurality of semiconductors of the power converter are switched by optimized pulse patterns, and wherein the control unit is arranged to switch off transmission of the sign-of-life signal for initiating a protective intervention.

9. The power converter of claim 8, constructed in the form of a modular power converter, said modular power converter comprising at least two power converter modules, said control unit embodied to control at least two of the at least two power converter modules.

10. The power converter of claim 9, wherein the power converter modules are arranged in a series circuit.

11. The power converter of claim 9, wherein the power converter modules are arranged galvanically separated from one another.

12. A vehicle, comprising a power converter as set forth in claim 8.

13. A wind turbine, comprising a power converter as set forth in claim 8.

* * * * *